(12) United States Patent
Abe

(10) Patent No.: US 6,903,020 B2
(45) Date of Patent: Jun. 7, 2005

(54) METHOD OF FORMING BURIED WIRING IN SEMICONDUCTOR DEVICE

(75) Inventor: Kazuhide Abe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/765,155

(22) Filed: Jan. 28, 2004

(65) Prior Publication Data

US 2005/0009319 A1 Jan. 13, 2005

(30) Foreign Application Priority Data

Jul. 8, 2003 (JP) .......................................... 2003-271803

(51) Int. Cl.$^7$ ............................................ H01L 21/302
(52) U.S. Cl. ...................... 438/692; 438/626; 438/633; 438/687
(58) Field of Search ................................ 438/622–629, 438/631–633, 687, 690–692

(56) References Cited

U.S. PATENT DOCUMENTS 6,670,274 B1 * 12/2003 Liu et al. ..................... 438/692
2004/0266171 A1 * 12/2004 Aoki et al. .................. 438/622

FOREIGN PATENT DOCUMENTS

| JP | 2000-003912 | 1/2000 |
| JP | 2002-359244 | 12/2002 |

* cited by examiner

*Primary Examiner*—Tuan H. Nguyen
*Assistant Examiner*—Thanhha Pham
(74) *Attorney, Agent, or Firm*—Rabin & Berdo, P.C.

(57) ABSTRACT

A method of forming buried wiring, includes the steps of forming an insulating layer having a trench on a semiconductor substrate; forming a conductive layer mainly composed of copper on the insulating layer in such a manner that the trench is filled with the conductive layer; removing an oxide layer generated in a surface of the conductive layer by oxidation; forming a cap layer made of a material having less mechanical strength than the oxide layer, on the conductive layer; and removing the cap layer and a part of the conductive layer by chemical mechanical polishing in such a manner that the conductive layer is left in the trench.

7 Claims, 2 Drawing Sheets

METHOD OF FORMING BURIED WIRING IN SEMICONDUCTOR DEVICE

BACKGROUND OF THE INVENTION

1. Field of the Invention

The present invention relates to a method of fabricating a semiconductor device, particularly, a method of forming buried wiring of a semiconductor device.

2. Description of the Related Art

In a general procedure of forming a buried copper wiring structure, an insulating layer is formed on a semiconductor substrate (wafer) on which a semiconductor element is formed; a trench for wiring is formed in this insulating layer; copper is deposited on an area including the inside of this trench; then the surface is flattened through chemical mechanical polishing (CMP), as disclosed in for example Japanese Patent Application Kokai (Laid-Open) Publication No.2000-3912 and Japanese Patent Application Kokai (Laid-Open) Publication No.2002-359244. If a thick oxide layer has been produced on a surface of the copper layer deposited on the wafer in the course of leaving the wafer in the atmosphere or the like, the speed of CMP decreases. In an early stage of CMP, the oxide layer is removed by applying a high polishing pressure in order to improve the throughput. Furthermore, in a next stage, the polishing pressure is lowered in order to reduce dishing which results from excessive polishing in a surface of the copper layer filling the trench, and erosion which will lead to unevenness in thickness of the insulating layer.

A requirement for an insulating layer disposed between conductive layers overlapping vertically or between conductive layers neighboring horizontally in a semiconductor device is a minimized dielectric constant (a low dielectric layer or a low-k dielectric layer). If the density of the insulating layer is lowered by increasing porosity, for instance, to provide a low-k dielectric layer, the mechanical strength of the insulating layer decreases, thereby increasing the possibility of troubles such as the delamination of the layer during polishing. Accordingly, a minimized polishing pressure lower than 1.5 psi, for instance, is required, and it is becoming increasingly hard to adopt the above-described technique to change the polishing pressure. If both the dielectric constant of the insulating layer and the polishing pressure are further lowered, the throughput will remarkably decrease.

A chemical solution containing complex ions may be used in CMP, to form a copper complex having lower mechanical strength than copper. However, the reaction of the complex ions and the oxide layer is too slow to achieve a sufficiently high polishing speed at a lowered polishing pressure.

SUMMARY OF THE INVENTION

It is an object of the present invention to provide a method of forming buried wiring in a semiconductor device with relatively high throughput at a lowered polishing pressure.

According to the present invention, a method of forming buried wiring, includes forming an insulating layer having a trench on a semiconductor substrate; forming a conductive layer mainly composed of copper on the insulating layer in such a manner that the trench is filled with the conductive layer; removing an oxide layer generated in a surface of the conductive layer by oxidation; forming a cap layer made of a material having less mechanical strength than the oxide layer, on the conductive layer; and removing the cap layer and a part of the conductive layer by chemical mechanical polishing in such a manner that the conductive layer is left in the trench.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

FIGS. 1A to 1F are cross-sectional views schematically showing process in a method of forming buried wiring of a semiconductor device in accordance with a first embodiment of the present invention.

Figure 1A:
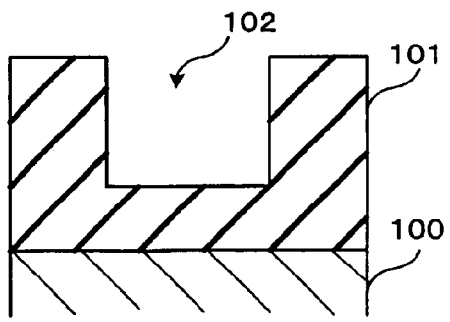
FIGS. 1A to 1F are cross-sectional views schematically showing process in a method of forming buried wiring of a semiconductor device in accordance with a first embodiment of the present invention.

In the method of forming buried wiring of the first embodiment, an insulating layer 101 is first formed on a semiconductor substrate (wafer) 100 in which a semiconductor element is formed, and a trench 102 for wiring is then formed in an area where a wiring line will be formed (i.e., an area corresponding to the wiring pattern), in the insulating layer 101, as shown in FIG. 1A. In FIG. 1A, the insulating layer 101 is formed on the semiconductor substrate 100, but a different layer or layers (multiple insulating layers, for instance) may be disposed between the insulating layer 101 and the semiconductor substrate 100. The insulating layer 101 is formed, for instance, by chemical vapor deposition (CVD). The insulating layer 101 is made of silicon dioxide ($SiO_2$) and is 500 nm thick, for instance. The trench 102 is formed by photolithography and etching. An apparatus used for etching is a magnetron-enhanced reactive ion etching (RIE) system, for instance. The apparatus used for etching may also be selected from the following: a magnetron-enhanced cathode-coupling etching system, a dual-frequency-excitation capacitive-coupled plasma etching system, an inductive coupled plasma (ICP) etching system, a helicon plasma etching system, and an electron cyclotron resonance (ECR) plasma etching system. An appropriate system selected from those etching systems can be used also for etching an insulating layer (not shown) other than the insulating layer 101 shown in FIG. 1. A gas mixture of octafluorocyclobutane ($C_4F_8$), carbon monoxide (CO), oxygen ($O_2$), and argon (Ar) can be used as an etching gas for the insulating layer 101, for instance. Sample etching conditions are as follows. The gas flow rate of $C_4F_8$ is 14 sccm (standard cubic centimeters per minute), the gas flow rate of CO is 50 sccm, the gas flow rate of $O_2$ is 5 sccm, the gas flow rate of Ar is 30 sccm, radio-frequency (RF) power applied to the electrode of the etching system is 1.5 kW, and the pressure in the chamber of the etching system is 50 mTorr.

Figure 1B:
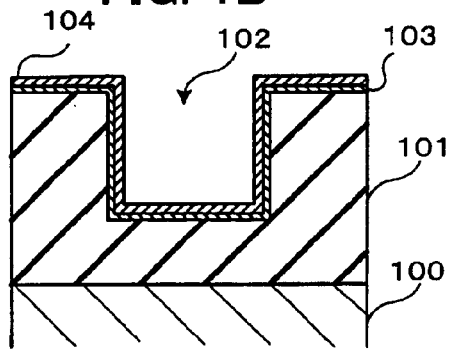

Next, a barrier layer 103 is formed on the surface of the insulating layer 101, including the inner surface of the trench 102, as shown in FIG. 1B. The barrier layer 103 is, for instance, a tantalum nitride (TaN) layer deposited by sputtering. The thickness of the barrier layer 103 is 50 nm, for instance. The sputtering process to form the barrier layer 103 is performed with high directivity and, for instance, with tantalum (Ta) used as the target material and a gas mixture of argon and nitrogen (Ar/$N_2$) used as the process gas. Sample sputtering conditions of the apparatus used for sputtering are: the atmospheric pressure in the sputtering apparatus is 3 mTorr; the direct-current (DC) power supplied to the electrode of the sputtering apparatus is 6 kW; and the film deposition temperature is 150° C.

Then, on the surface of the barrier layer 103, a copper (Cu) seed layer 104 is formed, as shown in FIG. 1B. The thickness of the copper seed layer 104 is 150 nm, for instance. The copper seed layer 104 is formed by sputter deposition of copper. This sputter deposition process is performed with high directivity, using copper as the target material and argon as the process gas. Sample sputtering conditions of the sputtering apparatus are: the atmospheric pressure in the sputtering apparatus is 2 mTorr; the DC power supplied to the electrode of the sputtering apparatus is 12 kW; and the film deposition temperature is 30° C.

Figure 1C:
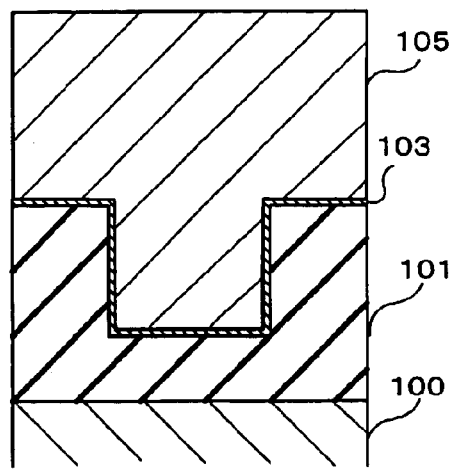

Copper electroplating is next provided to fill the trench 102 with copper and to give copper plating to an area of the copper seed layer 104 including inside of the trench 102, as shown in FIG. 1C. The copper seed layer 104 and the copper plating layer (i.e., electroplating layer) disposed thereon form a copper layer (i.e., conductive layer) 105. The electroplating process to form the copper layer 105 is carried out to deposit a copper layer sufficiently thick enough to fill the trench 102. The plating solution used for electroplating contains copper sulfate ($CuSO_4+5H_2O$) to precipitate copper, sulfuric acid ($H_2SO_4$) to improve electric conduction, chlorine (Cl) to improve the brightness and smoothness of a part with high current density and to stimulate the dissolution of the soluble anode (phosphorus-containing copper, for instance), and a plating assistant to improve the filling capability (i.e., filling power of the material used for filling the trench, which indicates how easily the trench can be filled with the material), for instance. This electroplating process to deposit the copper layer 105 is performed by setting the temperature of the plating solution to 25° C. and maintaining the plating current constant, for instance. The current density of the plating current may be switched between two settings, such as 0.2 A/$dm^2$ (ampere per square decimeters) in a first stage and 2 A/$dm^2$ in a second stage. A reason for the lower current density selected in the first stage is that, if electroplating is performed at a high current density in the first stage, the plating layer will block the fine opening of the trench 102, and voids will be formed in the trench 102. A reason for the higher current density selected in the second stage is that, if plating is continued at a low current density, the plating deposition rate will be very slow, and a long time will be required to fill the trench of a large pattern.

After the steps described above, the wafer is placed in a furnace and is subjected to heat treatment, for instance, in a mixed atmosphere of nitrogen ($N_2$) and hydrogen ($H_2$) at a temperature ranging from 100° C. to 350° C. for 1 to 300 minutes. The similar heat treatment may be carried out on a hot plate. The heat treatment after the deposition of copper stimulates the crystal growth of copper grains in the fine-grained copper layer 105 and gives stability to the hardness, crystallinity, resistivity, and the like of the copper layer 105.

Figure 1D:
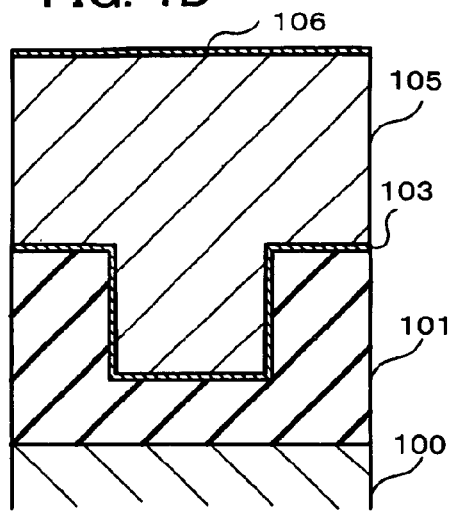

In the heat treatment, when oxygen remaining in the apparatus used for heat treatment meets the hot copper layer 105, an oxide layer (copper oxide layer) 106 is formed in a surface of the copper layer 105, as shown in FIG. 1D. While the wafer is left at a room temperature after the heat treatment, oxidation of the surface of the copper layer 105 proceeds.

Figure 1E:
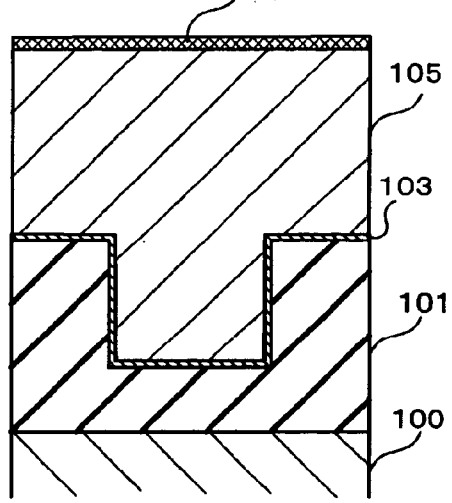

The heat-treated wafer with the copper layer 105 is then subjected to deoxidizing to remove the oxide layer 106. After removing the oxide layer 106, the wafer is transferred in a vacuum to another chamber, and then a cap layer 107 is deposited on a surface of the copper layer 105, as shown in FIG. 1E. The cap layer 107 has a function of preventing a copper oxide layer from being formed in a surface of the copper layer 105. For instance, the deoxidizing may be carried out by a heat treatment in an atmosphere of a gas mixture of $N_2$ and $H_2$ at a temperature ranging from 100° C. to 350° C. for a period ranging from 10 seconds to 5 minutes. The cap layer 107 may be a titanium silicon nitride (TiSiN) layer of 10 nm thick, for instance. The TiSiN layer is formed by sputtering under the following conditions, for instance: the target material is $Ti_3Si_5$; the process gas is an Ar/$N_2$ gas mixture; the pressure of the sputtering atmosphere in the sputtering apparatus is 3 mTorr; the DC power supplied to the sputtering apparatus is 0.5 kW; and the film deposition temperature is 100° C. In the description given above, the cap layer 107 is formed after deoxidizing is completed. The deoxidizing process to remove the oxide layer 106, however, may be carried out after the cap layer 107 is formed, because hydrogen ($H_2$) molecules can move through the cap layer 107. The oxide layer 106 may also be removed from the surface of the heat-treated plating by sputtering using an inert gas (Ar sputtering, for instance) before the cap layer 107 is formed. If the oxide layer 106 is not formed, or if the oxide layer 106 is too thin to degrade the throughput remarkably, the step of removing the oxide layer 106 may be skipped.

Figure 1F:
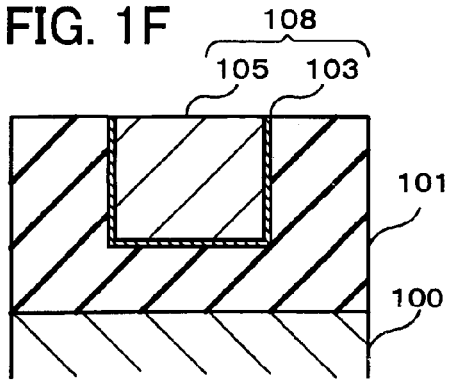

The cap layer 107, a part of the copper layer 105, and a part of the barrier layer 103 are removed by chemical mechanical polishing (CMP), as shown in FIGS. 1E and 1F, to form a wiring layer 108 including the copper layer 105 and barrier layer 103 buried in the trench 102. The CMP process is carried out in the following two steps, for instance. In the first step, the TiSiN layer provided as the cap layer 107 and the copper layer 105 are removed while the TaN layer provided as the barrier layer 103 is used as a stopper. In the second step, the barrier layer 103 outside the trench 102 is removed while the insulating layer 101 is used as a stopper. In the first step, a solution containing silica grains as polishing grains blended with hydrogen peroxide ($H_2O_2$) is used as slurry. To polish the cap layer 107, a chemical solution, which contains such organic complex ions that a reaction with a constituent element of the cap layer 107 yields an organic complex, is also added. This method is similar to the method of removing a barrier metal layer, disclosed for example in Japanese Patent Application Kokai (Laid-Open) Publication No. 2000-294630. It is desirable that the solution be adjusted to bring the selective etching ratio between the cap layer and the copper layer close to 1. Sample polishing conditions are: the polishing pad is a laminate of non-woven cloth and independent foam layer; the slurry flow rate is 200 ml/min; the polishing pressure is 2 psi; the rotation speed of the carrier head holding the polishing pad is 120 rpm; the rotation speed of the table holding the wafer to be polished is 120 rpm. In the second step, a solution containing silica grains as polishing grains blended with hydrogen peroxide ($H_2O_2$) is used as slurry again. Sample polishing conditions are: the polishing pad is a laminate of non-woven cloth and independent foam layer, as in the first step; the slurry flow rate is 200 ml/min; the polishing pressure is 2 psi; the rotation speed of the carrier head holding the polishing pad is 80 rpm; the rotation speed of the table holding the wafer to be polished is 80 rpm.

The method of forming buried wiring of the first embodiment includes a step of removing the oxide layer 106 or a step of providing the cap layer 107 to inhibit the generation of the oxide layer, so that a relatively high throughput can be achieved even if the polishing pressure in CMP is lowered.

The wiring layer 108 described above is made of copper, but the wiring layer 108 may be made of a conductive material mainly composed of copper, such as a copper alloy.

Second Embodiment

FIGS. 2A to 2F are cross-sectional views schematically showing process in a method of forming buried wiring of a semiconductor device in accordance with a second embodiment of the present invention.

Figure 2A:
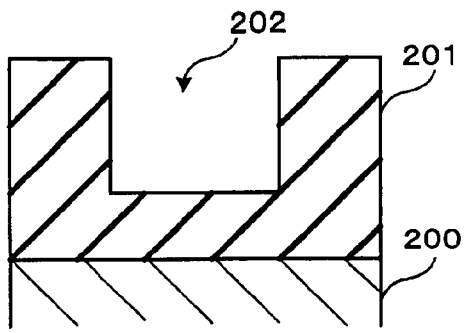
FIGS. 2A to 2F are cross-sectional views schematically showing process in a method of forming buried wiring of a semiconductor device in accordance with a second embodiment of the present invention.
Figure 2D:
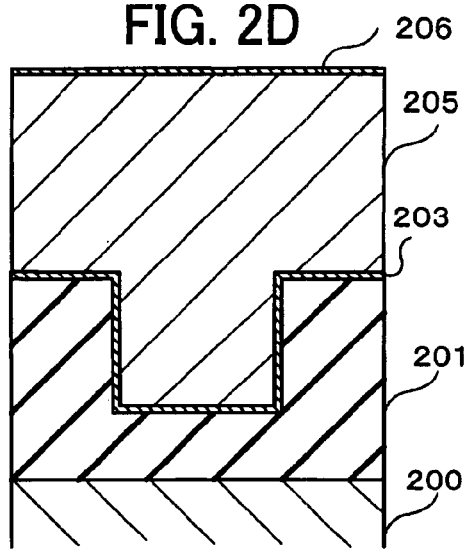
Figure 2B:
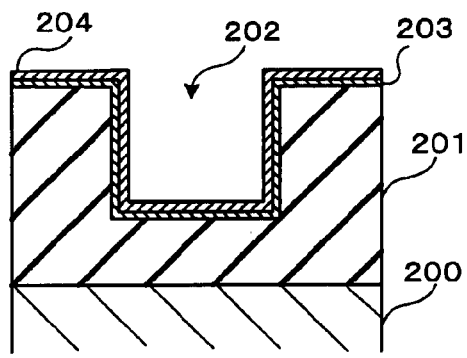
Figure 2E:
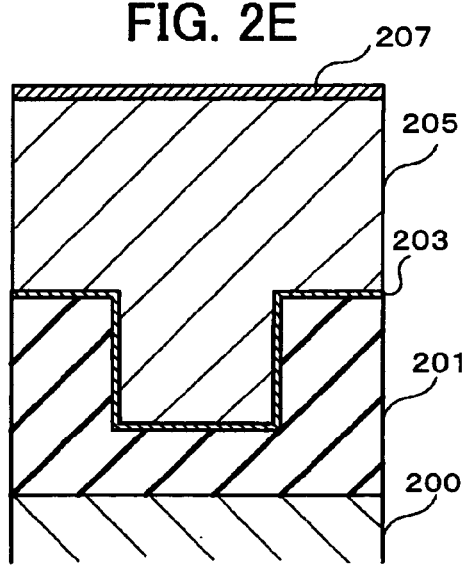
Figure 2C:
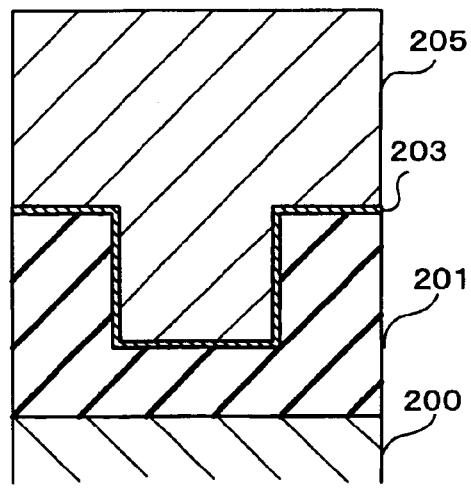

In the method of forming buried wiring of the second embodiment, an insulating layer 201 is first formed on a semiconductor substrate (wafer) 200 in which a semiconductor element is formed, and a trench 202 for wiring is then formed in an area where a wiring line will be formed (i.e., an area corresponding to the wiring pattern), in the insulating layer 201, as shown in FIG. 2A. A barrier layer 203 is next formed on the surface of the insulating layer 201, including the inner walls of the trench 202, and a copper (Cu) seed layer 204 is formed on the barrier layer 203, as shown in FIG. 2B. Copper electroplating is next performed to give copper plating to an area including the inside of the trench 202, as shown in FIG. 2C. The copper seed layer 204 and the copper plating layer (i.e., electroplating layer) disposed thereon form a copper layer (i.e., conductive layer) 205. Then, while the wafer is heat-treated or left at a room temperature, the surface of the copper layer 205 is oxidized to yield an oxide layer 206, as shown in FIG. 2D. The steps illustrated in FIGS. 2A to 2D are the same as the steps illustrated in FIGS. 1A to 1D, of the first embodiment described above in detail.

The wafer is then subjected to deoxidizing to remove the oxide layer 206. After removing the oxide layer 206, a cap layer 207 is deposited on a surface of the copper layer 205, as shown in FIG. 2E. The cap layer 207 has a function of preventing the surface of the copper layer 205 from being oxidized, as shown in FIG. 2E. The deoxidizing is performed by carrying out $NH_3$ plasma processing, for instance, and the cap layer 207 is formed by carrying out $NH_3$ plasma processing again. Sample nitriding conditions are: the substrate temperature is 380° C.; the gas flow rate of $NH_3$ is 70 sccm; the gas flow rate of $N_2$ is 20 sccm; the pressure in the chamber is 5 Torr; the RF power is 450 W; the distance between the electrodes is 650 mm; the processing time is 10 to 30 seconds. The cap layer 207 may not be a copper nitride layer and may be replaced, for instance, by a copper boride layer, a copper sulfide layer, or a copper phosphide layer, which can avoid the oxidation of copper. Alternatively, the deoxidizing may be carried out by a heat treatment in an atmosphere of hydrogen ($H_2$) at a temperature ranging from 100° C. to 350° C., and then the gas may be switched to form the cap layer 207 in the same chamber.

Figure 2F:
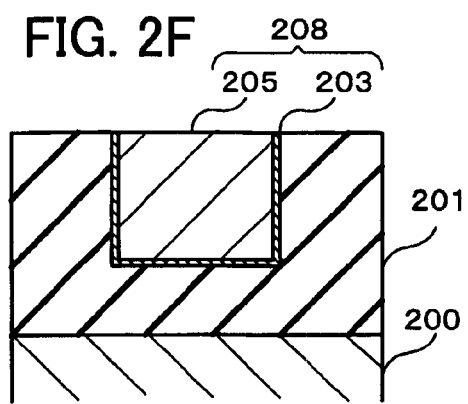

The cap layer 207, a part of the copper layer 205, and a part of the barrier layer 203 are next removed by chemical mechanical polishing (CMP), as shown in FIG. 2F, to form a wiring layer 208 including the copper layer 205 and barrier layer 203 buried in the trench 202. The step illustrated in FIG. 2F is the same as the step illustrated in FIG. 1F, of the first embodiment described above in detail.

The method of forming buried wiring of the second embodiment includes a step of removing the oxide layer 206 or a step of providing the cap layer 207 to inhibit the generation of the oxide layer 206, so that a relatively high throughput can be implemented even if the polishing pressure of CMP is lowered.

In the method of forming buried wiring of the second embodiment, the removal of the oxide layer 206 from the surface of the copper layer 205 and the formation of the cap layer 207 can be carried out in the same step or can be successively carried out in the same chamber, so that the throughput can be improved further.

The wiring layer 208 described above is made of copper, but the wiring layer 208 may be made of a conductive material mainly composed of copper, such as a copper alloy. The second embodiment is the same as the first embodiment, except for the description given above.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of forming buried wiring, comprising:

forming an insulating layer having a trench on a semiconductor substrate;

forming a conductive layer mainly composed of copper on said insulating layer in such a manner that said trench is filled with said conductive layer;

removing an oxide layer generated in a surface of said conductive layer by oxidation;

forming a cap layer made of a material having less mechanical strength than said oxide layer, on said conductive layer; and removing said cap layer and a part of said conductive layer by chemical mechanical polishing in such a manner that said conductive layer is left in said trench.

2. The method according to claim 1, wherein said forming a cap layer includes:

subjecting a surface of said conductive layer to any of nitriding, boronizing, sulfurating, and phosphorating, thereby forming any of a nitride layer, a boride layer, a sulfide layer, and a phosphide layer in said surface of said conductive layer.

3. The method according to claim 1, further comprising:

forming a barrier layer on said insulating layer prior to said forming said conductive layer so that said barrier layer is disposed between said insulating layer and said conductive layer.

4. The method according to claim 1, wherein said forming a conductive layer comprises:

forming a seed layer mainly composed of copper on said insulating layer; and depositing a conductive material mainly composed of copper on said seed layer.

5. The method according to claim 1, further comprising:

heat-treating said conductive layer at a temperature ranging from 100° C. to 350° C.

6. The method according to claim 1, wherein said removing an oxide layer includes:

deoxidizing said oxide layer.

7. The method according to claim 1, wherein said removing an oxide layer includes:

removing said oxide layer by sputtering using an inert gas.

* * * * *